United States Patent [19]
Spink, Jr.

[11] Patent Number: 4,926,360
[45] Date of Patent: May 15, 1990

[54] ELECTRONIC GAGE AMPLIFIER AND DISPLAY

[75] Inventor: Stanley T. Spink, Jr., North Kingstown, R.I.

[73] Assignee: Brown & Sharpe Manufacturing Co., Kingstown, R.I.

[21] Appl. No.: 179,064

[22] Filed: Apr. 8, 1988

[51] Int. Cl.[5] ...................... G01G 25/00; G01R 17/06
[52] U.S. Cl. .................................. 364/571.01; 341/120; 324/99 D; 364/550; 364/571.05
[58] Field of Search ................... 364/474.35, 481, 483, 364/550, 560, 561, 571.01, 571.02, 571.03, 571.04, 571.05, 571.06, 571.07, 571.08, 579; 341/120, 156; 371/15, 25, 26; 324/73 AT, 99 D, 114, 115

[56] References Cited

U.S. PATENT DOCUMENTS

| | | | |
|---|---|---|---|
| 4,329,641 | 5/1982 | Ikeda et al. | 324/99 D |
| 4,364,027 | 12/1982 | Murooka | 364/571.05 |
| 4,642,636 | 2/1987 | Smith et al. | 364/571.01 |
| 4,663,586 | 5/1987 | Swerlein et al. | 364/571.01 |
| 4,700,174 | 10/1987 | Sutherland et al. | 341/120 |
| 4,755,951 | 7/1988 | Hollister | 364/571.06 |
| 4,795,972 | 1/1989 | Roppelt et al. | 324/114 |
| 4,799,041 | 1/1989 | Layton | 341/120 |
| 4,804,939 | 2/1989 | Cake et al. | 324/99 D |

Primary Examiner—Parshotam S. Lall
Assistant Examiner—Kevin J. Teska
Attorney, Agent, or Firm—Wolf, Greenfield & Sacks

[57] ABSTRACT

The invention provides an electronic gage amplifier which converts sinusoidal signals representing measurement data from a gage head into a visual display of measurement data. The measurement signals are received by the amplifier at the input of a mixer where they are combined with a coarse adjustment signal. The coarse adjustment signal, which is provided by a multiplying digital-to-analog converter (MDAC) which is controlled by a microcomputer, yields a fine adjustment signal when mixed with the measurement signal. The resulting fine adjustment signal is amplified by a preamplifier, translated into a steady-state voltage by a programmable-gain demodulate-and-hold circuit (D/H) and converted to a digital word by an analog-to-digital converter (ADC). The microcomputer further causes a known reference signal to be processed through the MDAC, mixer, preamplifier, D/H, and ADC. The microcomputer compares the resulting digital word to a known reference value and determines any errors introduced by the aforementioned circuitry. The microcomputer then combines the digital word obtained in response to the fine adjustment signal with a digital word representative of the coarse adjustment signal and a digital word representative of the calculated error introduced by the circuitry in such a manner so as to obtain a correct measurement value which is then displayed.

32 Claims, 7 Drawing Sheets

ELECTRONIC GAGE AMPLIFIER AND DISPLAY

FIELD OF THE INVENTION

The invention relates to electronic gage amplifiers. More particularly, the invention relates to apparatus for converting electrical signals from one or more transducers, such as position transducers, into display information.

BACKGROUND OF THE INVENTION

Electronic gage amplifiers are commonly used in industry in combination with electronic gages (i.e., transducers) to measure precision crafted components. Uses of such devices are practically endless. Such electronic gage amplifiers interface to one or more transducer gages of a type, for example, that convert a distance measurement into an electrical signal. The gages used for such applications are typically either linear variable differential transformer (L.V.D.T.) type transducers or half-bridge transducers. The invention, however, may be used with various types of transducers, including transducers which measure variables other than distance.

An electronic gage amplifier will typically have a plurality of electrical jacks for connecting gages to the amplifier. For either L.V.D.T. or half bridge transducers, the qage amplifier provides two sinusoidal driving voltages to one or two coils within the body of each gage. The voltages are of equal amplitude and frequency but opposite phase (i.e. 180° offset from each other). These driving voltages will hereinafter be referred to as SINE and $\overline{\text{SINE}}$. The gage provides one or two output line(s) back to the qage amplifier which carry some combination of the SINE and $\overline{\text{SINE}}$ driving signals, the combination depending on the position of the gage head. The gage head is the portion of the gage which contacts the part being measured and whose displacement in relation to the transducer coils is the distance measured. The gage head in either the L.V.D.T. or half-bridge type gage has a point in the center of the range of displacement of the gage head defined as the zero point, at which the driving signals combine to cancel each other so that the signal on the output line is zero volts. When the gage head is displaced to one side of the zero point, a sinusoidal voltage having frequency equal to the driving voltages and phase equal to that of one of the driving voltages appears on the output line(s). The amplitude is directly related to the distance of displacement from the zero point. When the qage head is displaced from the zero point in the opposite direction, the signal on the output line(s) is a sinusoidal voltage with a phase equal to that of the other driving voltage. As before, the amplitude is directly related to the displacement from the zero point.

FIG. 1 shows a block diagram of the circuitry of a typical electronic gage amplifier unit of the prior art. This particular embodiment is designed for use with two gages, designated the "A" gage and the "B" gage, respectively. The unit circuitry consists of an oscillator 12, an AC amplifier 14, a synchronous passive demodulator 16, a DC amplifier 18 and a display 20. The oscillator 12 provides to the gages SINE and $\overline{\text{SINE}}$ signals having a frequency typically in the range of 5 to 15 kHz, on lines 13A and 13B, respectively. The SINE and $\overline{\text{SINE}}$ outputs, which differ in phase by 180°, are also sent to the demodulator 16. The amplifier 14 receives a sinusoidal response signal from each of gages A and B, such sinusoidal signals having phase and amplitude indicative of a distance measurement. The amplifier 14 is a sine-wave amplifier and has a voltage gain on the order of 1000. The output of the amplifier 14 is fed into demodulator 16. Demodulator 16 is a synchronous passive demodulator which provides a steady-state voltage in response to the input from the carrier amplifier 14. The DC signal output of demodulator 16 is then fed into signal amplifier 18, where it is further amplified and sent to the display 20. Typically, the display 20 is either an analog display having a magnetic needle pointer or a digital display.

Two types of errors are typically introduced to the measurement reading by the electronic gage amplifier circuitry. The first type of error is termed the zero, or offset, error. This type of error causes the output on line 19 (see FIG. 1) to be slightly offset from the value that it should ideally provide in response to the signal from the gage head. This is caused by fixed D.C. offset voltages and thermal drift of the electronics which is inherent to the circuitry of the unit. The second type of error is termed span, or sensitivity, error and is an error that increases in value as the measurement reading gets further away from the center point of the span error. Due to aging of components and temperature dependent circuitry operation, the amplification in the circuitry will vary slightly from the desired amplification. For instance, if the carrier amplifier 14 is nominally designed to provide a gain of 1000, it may in fact be providing a gain of only 999.

Additionally, it is inherent to all gages of the L.V.D.T. or half-bridge types that they supply, in addition to the measurement signal, a quadrature voltage. The latter is an error voltage which effects the accuracy of the measurement as read by the gage amplifier. This is not an error produced by the circuitry of the electronic gage amplifier but, rather, by the gages themselves. This quadrature error voltage is a sinusoidal voltage which is 90° out of phase with both the SINE and $\overline{\text{SINE}}$ driving voltages as well as with the gage s own valid output voltage. The quadrature error voltage is due to impedance mismatch between the coils in the gage. Unfortunately, it is virtually impossible to provide perfectly matched coils. When measuring small dimensions, the amplitude of the quadrature voltage is relatively large in comparison with the valid measurement signal. In the electronic gage amplifiers of the prior art as shown in FIG. 1, the quadrature voltage is amplified along with the signal voltage. This high quadrature voltage from a gage head can saturate the amplifier 14 and result in inaccurate operation and significant errors in the measurement readings.

Another error which is typical of certain gage heads is a phase shift error. Instead of the sinusoidal output of the gage being exactly in phase with the SINE or $\overline{\text{SINE}}$ driving voltage, the output of the gage head is typically phase shifted approximately 5° to 10° from the driving voltage. This phase shift is a constant for any given gage. Prior art electronic gage amplifiers typically correct for this phenomenon by inserting external phase correction circuitry between the electronic gage amplifier and the gages to equalize the qage output phase to the driving voltage phase.

The operating controls for the gage amplifier are shown generally at 22. A group of knobs, switches and/or buttons is typically provided on the surface of the housing of the gage amplifier for controlling certain operating functions. The three most essential controls are shown at 22. The range control 24 is used to set the gage amplifier to one of a specific group of full scale ranges. For instance, the Model TA Comparator Gage Amplifier of Taper Micrometer Corporation of Worcester, Massachusetts provides two possible full scale ranges, +/−0.001" and +/−0.0001". Other prior art gage amplifiers have up to five or more possible range settings. Typically, the range control switch 24 operates by switching in different resistance values across an operational amplifier within amplifier block 14 to adjust its gain and provide the different ranges. Resistor switching, however, as is true with any devices for altering hardware within a system, creates reliability problems for the unit and introduces additional errors to the measurement readings because of the thermal characteristics of switches as well as other reasons.

Zero control 26 is used to adjust the point in the travel of the qage head at which a zero will be displayed on the amplifier display 20. In most cases, it would be desirable to set the display zero at the mechanical zero point of the gage head, which is at the exact center of the gage head range of displacement, because the qage operates most linearly, and therefore most accurately, around the mechanical zero point. Occasionally, however, it is convenient to set the display zero at a different point. Prior art electronic gage amplifiers typically provide a potentiometer for adjusting the zero point. The unit may have a mark indicating where the potentiometer must be positioned to match the display zero to the mechanical zero. Manual potentiometer adjustments, however, are far from accurate.

The function control switch 28 can be of a variety of forms. Basically, function control switch 28 is used to instruct the electronic gage amplifier what information to read and display. In its most basic form it is used to choose between displaying what is read on gage A and what is read on gage B. In more advanced forms it can be used to effect display of the difference between gage A or qage B, the summation of gage A and gage B, the average of gage A or gage B and many other possibilities.

In the electronic qage amplifiers of the prior art, particularly the analog magnetic needle type, the display will not show the actual absolute value of the measurement, but rather, a scaled value. The operator must look at both the displayed value and the range setting control 24 in order to determine what measurement he is reading. Not only is it inconvenient for the operator to look to two places, but it also frequently leads to errors because the operator must perform mental arithmetic while reading the data and further because the range setting control 24 can be easily misread.

Periodic calibration of numerous parameters is necessary in order to keep the gage amplifier working accurately. The calibration controls are usually provided within the enclosure of the electronic gage amplifier since they should only be adjusted by a skilled technician and not by the average user. Periodic calibration is necessary to correct for aging and electronic drift of components. Gain control 30 and 32, for gages A and B, respectively, for sine-wave amplifier 14 must be adjusted to match amplifier sensitivity (or span) to each gage head. These controls are subject to damage as they are readjusted each time a new gage head is used. There is also an offset control 34 for the demodulator and a second offset control 36 for the DC amplifier 18, to correct for electronic drift of the zero point of the gage amplifier. Another gain control 38 may be provided for the DC amplifier 18.

There are numerous shortcomings to the prior art electronic gage amplifiers. For instance, every time the range setting 24 is changed, the zero control 26 must be readjusted because each time a resistor is switched across the operational amplifier in block 14, new offset errors and phase errors are introduced in the circuitry. Changing ranges after the initial set up of a qage head also causes sensitivity errors to occur in the measurement. Further, if a measurement is off scale in one range, it is necessary for the operator to manually change range control 24 to select a different scale.

Additionally, the prior art electronic gage amplifiers do not provide an accurate means for locating the mechanical zero point of the gage head. As stated earlier, it is desirable to center the measurement range around the mechanical zero point of the gage head since it is the most linear operating region.

Therefore, it is an object of the present invention to provide an improved electronic qage amplifier.

It is a further object of the present invention to provide an electronic gage amplifier which eliminates the need for periodic calibration.

It is yet another object of the present invention to provide an electronic gage amplifier wherein all relevant information about the measurement is provided to the operator in one display location, at a single glance.

It is a further object of the present invention to provides an electronic qage amplifier with means for quickly locating the exact mechanical zero point of the gage head.

It is yet another object of the present invention to provide an amplifier which offers hands off operation by automatically changing ranges It is a further object of the present invention to provide an amplifier which introduces no gain or offset error when the range settings are changed.

SUMMARY OF THE INVENTION

The electronic gage amplifier of the present invention utilizes a partially closed loop, self-calibrating architecture under control of a microcomputer. The microcomputer oversees all system functions and eliminates the need for periodic calibration of the device by automatically testing and adjusting for error factors in the circuitry of the electronic gage amplifier.

A sine wave synthesizer, under control of the microcomputer, generates a SINE and $\overline{\text{SINE}}$ signal to drive one or more gages. The SINE and $\overline{\text{SINE}}$ outputs are also fed to a multiplying digital-to-analog converter (MDAC) as its reference voltage inputs. The MDAC output is provided at the input of a mixer and preamplifier circuit. The MDAC is programmed by the microcomputer to provide at its output either a known reference signal or a "coarse adjustment" signal. The outputs of the gages in response to the driving voltages and the displacement of the gage heads are fed into the mixer and preamplifier circuit. The preamplifier provides a voltage gain of only approximately 10. The mixer, under control of the microcomputer, periodically and sequentially samples a known reference signal (or error detection signal) followed by each gage signal summed with the "coarse adjustment" signal. The coarse adjustment function and the error detection function will be described in more detail shortly. A programmable-gain demodulate-and-hold circuit is connected to the output of the mixer/preamplifier and generates a voltage having sign and magnitude corresponding to the mixer/preamplifier output, and holds that voltage for a specified period of time. An analog-to-digital converter is coupled to the output of the programmable gain demodulate-and-hold circuit and provides a corresponding digital signal from the voltage at the output of the demodulate and hold circuit. That digital signal is directed into the microcomputer which operates on the digital data and in response supplies instructions and display data to a display subassembly. The display subassembly includes a liquid crystal display screen which displays the measurement data. A touch sensitive keypad is provided to facilitate setting ranges and zero points, choosing the desired functions, selecting the gage(s) to be read and initiating other functions.

The microcomputer, by means of the MDAC, continuously performs two functions in an alternating pattern, a coarse adjustment function and an error detection function. In the former function, the MDAC is caused to provide a coarse adjustment signal to the mixer that is selected so as to have an amplitude slightly smaller than the gage signal which is currently being read and 180° out of phase therewith. The summation of this signal with the signal from the actual gage head results in a very small output voltage from the mixer. This reduces the dynamic range of the mixer output and prevents saturating later stages of the signal conditioning circuitry. The "coarse adjustment" value is factored back into the measurement at a later point, in the microcomputer software.

In the error detection function, the MDAC is controlled by the microcomputer to provide some mixture of the SINE and $\overline{\text{SINE}}$ reference inputs. The output of the MDAC is provided at an input of the mixer and preamplifier circuit the same as if it were an input from another gage head. The microcomputer instructs the MDAC to output one of several reference signals to the mixer/preamplifier circuit. The microcomputer then lets the reference signal propagate through the mixer, preamplifier, demodulate and hold circuit and analog-to digital converter and reads the output. Any deviation between the reference signal and the corresponding output of the ADC represents error introduced by the system. Offset (zero) and amplifier sensitivity (span) errors introduced by the circuitry are readily determinable.

The microcomputer then computes a correction factor which corrects for the errors introduced by the system. After the appropriate correction factor is calculated, the microcomputer simply subtracts the correction factor from the measurement reading from the ADC and adds in the "coarse adjustment" value which the MDAC had applied to the original signal in order to obtain the actual gage measurement reading.

The liquid crystal display screen is designed to provide all relevant information to the operator at a glance. The absolute measurement value is provided in both bar graph and digital display. In addition to displaying a numerical measurement value, the units (e.g. millimeters or inches) is also shown. No mental scale conversion is required of the operator. The display also shows the full scale range selected and its division values, the gage head or heads which are being displayed and in what relationship, and various other pertinent information.

DETAILED DESCRIPTION OF A PREFERRED EMBODIMENT

Description of the Block Circuit Diagram

Figure 1:
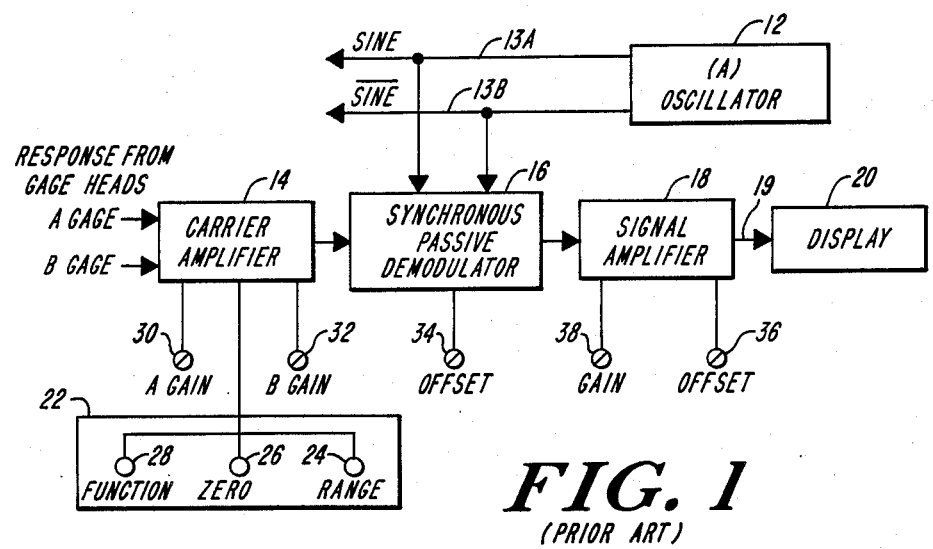
FIG. 1 shows a block circuit diagram of an electronic gage amplifier of the prior art.
Figure 2:
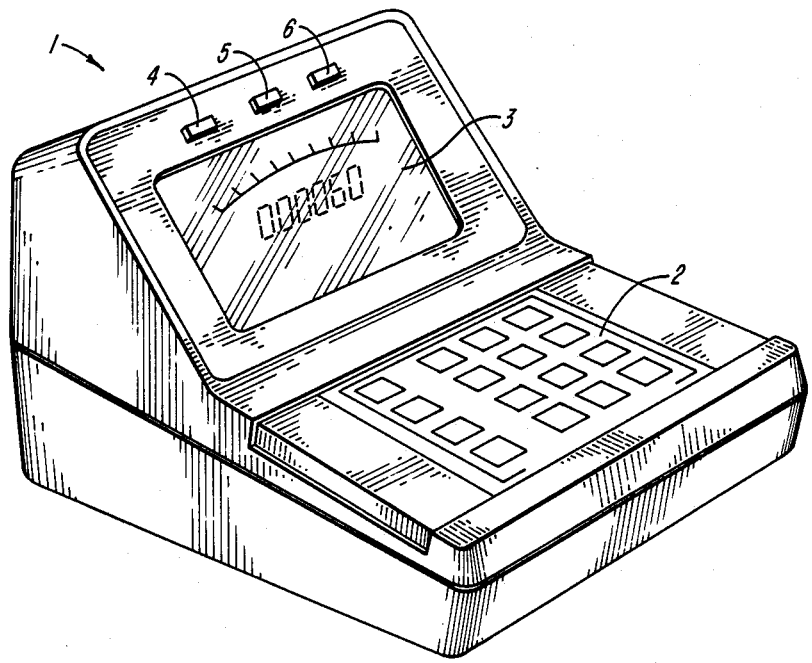
FIG. 2 shows a perspective view of a preferred embodiment of the electronic gage amplifier of the present invention.

FIG. 2 shows a perspective view of a preferred embodiment of the electronic gage amplifier of the present invention. The amplifier unit 1 is provided with a keypad 2 and a display 3. The unit 1 is meant to be placed on a table top and is easily transportable due to its light weight and small size. The display portion 3 may, for example, be a liquid crystal display and is at an angle of approximately 45° when the unit is placed flat on a table. The angle of the display facilitates easy reading of the information in the display by an operator standing in front of the unit. The keypad 2 is also angled slightly from the horizontal in order to facilitate easy viewing and finger access to the keys.

Figure 3:
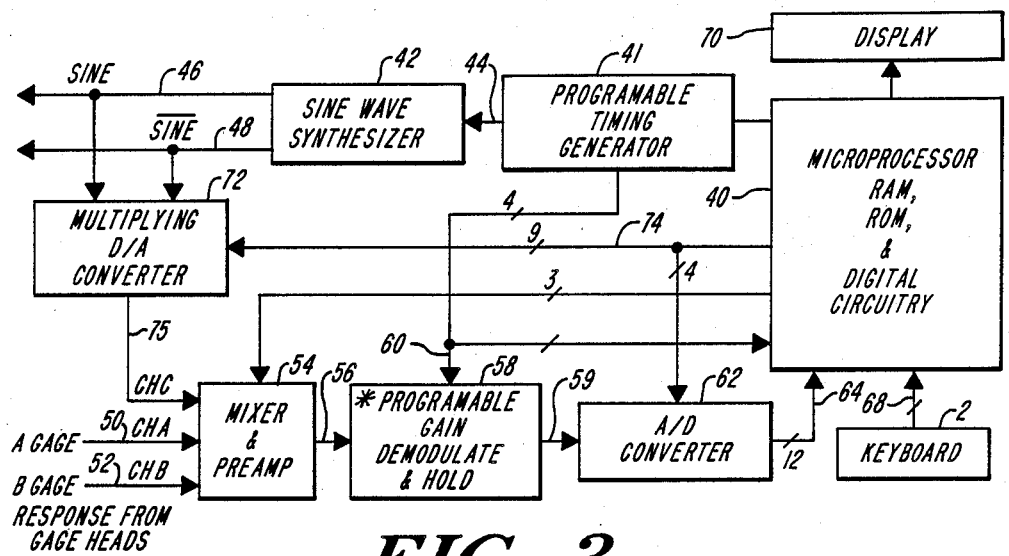
FIG. 3 shows a block circuit diagram of the electronic gage amplifier of the present invention.

FIG. 3 shows a block circuit diagram of the circuitry of the present invention adapted for use with two gages, A and B. The electrical connectors for the gages are plugged into compatible connectors on the back panel of the unit 1. A microcomputer 40 with on board memory is provided to control most major system functions described herein. A sine-wave synthesizer 42 is provided which supplies the SINE and $\overline{\text{SINE}}$ excitation voltages to the gages (not shown). The sine-wave synthesizer 42 receives a 12.8 kHz square wave from the programmable timing generator (41) via line 44 (throughout this disclosure the term "line" is used to connote both single and multiple line signal paths). The synthesizer 42 converts the 12.8 kHz square wave signal into 12.8 kHz SINE and $\overline{\text{SINE}}$ signals one lines 46 nd 48 to the gage connectors. The SINE and $\overline{\text{SINE}}$ signals are piece-wise linear approximations of true SINE and $\overline{\text{SINE}}$ signals. As described above, each gage head returns a signal to the electronic gage amplifier on line 50 or 52 indicative of a distance measurement; the phase (SINE or $\overline{\text{SINE}}$) denotes the direction the gage head is displaced from the zero position and the amplitude is directly related to the distance from the zero position. The inputs on lines 50 and 52 from the gage heads A and B are fed into mixer/preamplifier circuit 54.

The preamplifier section of the block 54 provides a gain of approximately 10, which is relatively small in comparison to the prior art. The mixer portion of block 54 operates as will be explained shortly. The output of mixer/preamplifier 54 is a sinusoidal signal which is supplied on line 56 to programmable-gain demodulate-and-hold circuit 58 (hereinafter D/H). Circuit 58 converts the sinusoidal waveform one line 56 into a steady-state DC voltage having polarity and amplitude which is uniquely representative of the sinusoidal waveform on line 56. The sign of the steady-state voltage represents the phase of the sinusoidal wave form from line 56 while the amplitude of the steady-state voltage represents the amplitude of the sinusoidal voltage on line 56. The manner in which the D/H accomplishes this conversion will be explained in greater detail shortly. The gain of D/H 58 is program controlled by the microcomputer via line 60. The output of the D/H 58 is fed to analog-to-digital converter (ADC) 62. In a preferred embodiment, the ADC 62 has 12 bits of resolution and an input voltage range of 5 volts. The digital output of the ADC 62 is fed into the microcomputer via lines 64. The microcomputer 40 operates on the data as directed by its software and by inputs on bus 68 from keypad 2 and supplies display instructions and data to the display unit or sub assembly, 70. As will be described in more detail below, the display 70 shows the desired measurement information in such a manner that all pertinent information about the measurement can be read by the operator at a single glance.

A multiplying digital-to-analog converter (MDAC) 72 takes the SINE and $\overline{SINE}$ signals on lines 46 and 48 as its reference voltage inputs. Under instruction from the microcomputer via data bus 74, the MDAC 72 supplies a signal on line 75 to mixer/preamplifier circuit 54 that is a selected combination of the SINE and $\overline{SINE}$ reference inputs. The output on line 75 from the MDAC 72 is fed into mixer/preamplifier circuit 54 as if it were a third gage input.

The signal on line 75 (channel C) can be one of two possible types of signals depending on the function which the microcomputer is executing. The microcomputer continuously sequences the unit through three modes: (1) read measurement from A gage (channel A), (2) read measurement from B gage (channel B) and (3) read reference signals from MDAC (channel C). If the microcomputer is reading either gage A or gage B, the signal on line 75 is caused to be a voltage that is almost equal to but slightly less than the incoming gage signal and 180° out of phase with it. The channel C voltage is mixed with the channel A or B voltage to produce a very small voltage signal at the mixer/preamplifier output which will not saturate the subsequent circuitry. Alternately, when the microcomputer is reading channel C, the signal on line 75 will be one of a group of reference signals which the microcomputer uses to calculate the offset and sensitivity errors which the circuitry in blocks 42, 54, 58 and 72 are causing. The microcomputer will compare the known reference signals with the output of ADC 62 in response to the reference inputs and calculate the zero and sensitivity errors introduced into the signals. The MDAC itself introduces an error to the system termed a "step" error. As the digital input value changes by one least significant bit, the analog output should change a specified value, called a "step". Digital-to-analog converters, however, do not operate ideally and therefore the steps are not perfect. The variation in the step from the ideal is negligible except when the transition in the digital input value causes all digital bits to change. For instance, in an eight bit digital-to-analog converter, this occurs when the digital input signal changes from 01111111 binary to 10000000 binary (7F hexadecimal to 80 hexadecimal). For any given digital to-analog converter the step error during this transition is a constant. The invention also detects and compensates for the step error. The manner in which the MDAC detects the span, offset and step errors will be described in detail in the following subsection.

Operation of the Electronic Gage Amplifier

Figure 4:
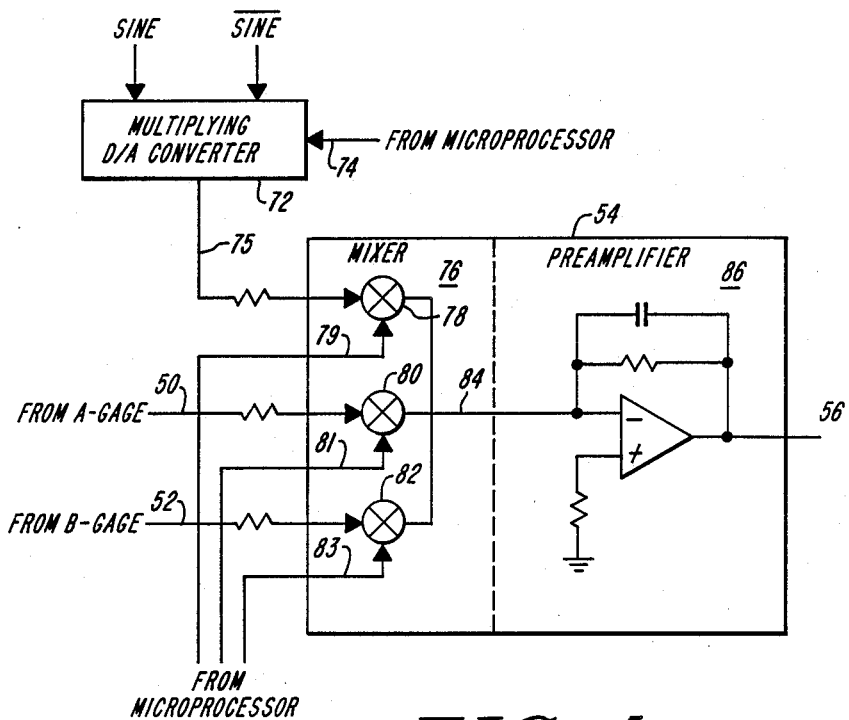
FIG. 4 shows exemplary circuitry for the mixer block of FIG. 3.

A schematic diagram of the circuitry of mixer/preamplifier block 54 is shown in FIG. 4. The mixer portion 76 basically consists of three electronic switches 78, 80 and 82. The switches are controlled by the microcomputer via lines 79, 81 and 83 respectively, to combine the input from the two gages, A and B, and the MDAC in some specified manner.

In the preferred embodiment, the microcomputer controls the switches 78, 80 and 82 to continuously cycle through three states. In the first state, switch 78 is closed and switches 80 and 82 are open. The microcomputer supplies a signal on line 74 to MDAC 72, causing the MDAC to provide a sinusoidal reference signal on line 75 to mixer/preamplifier 54. That signal propagates through the mixer/preamplifier 54, the programmable-gain D/H 58 and the analog-to digital converter (ADC) 62. The ADC output to the microcomputer 40 on line 64 ideally should correspond to the signal that was originally generated by the microcomputer on line 74. However, due to aging and drift characteristics of circuitry, it is highly likely that some error will be introduced by the analog circuit components within blocks 42, 54, 58 and 72 of FIG. 3. At this point, therefore, the microcomputer reads the data on lines 64, compares it with what was supplied on line 74 and determines the error, if any, that was introduced by the circuitry.

The microcomputer will determine both the zero (offset) error and the span (sensitivity) error in this fashion. To determine the offset error, the microcomputer supplies on line 74 a signal that instructs the MDAC 72 to provide a signal corresponding to zero gage output on line 75. Once the offset error which appears at the ADC output has been determined, the microcomputer then causes other known non-zero reference values to be supplied on line 75, reads the corresponding output values on lines 64, and, from the results, calculates the span (sensitivity) error.

In the second state, the microcomputer causes the mixer to close switches 78 and 80 and leave switch 82 open. This selects the A gage summed with the MDAC output. The microcomputer then supplies a signal on line 74, that instructs MDAC 72 to provide a signal on line 75 which is of nearly equal amplitude, but slightly smaller than the signal coming in from qage A, but 180° out of phase therewith. The result of this combination of signals produces a very small output signal from the mixer at node 84. This signal, as will be explained in more detail shortly, will not saturate the analog-to-digital converter 62 after it is amplified by the preamplifier and the D/H.

In the third state, switches 78 and 82 are closed and switch 80 is opened. This selects the B gage output summed with the MDAC output. The microcomputer once again instruct MDAC 72 to provide a signal on line 75 which is nearly equal in amplitude to the B gage output but 180° out of phase therewith. As above, this provides a minimum output at node 84 which is representative of the difference between the MDAC and the B gage.

In states 2 and 3, the MDAC 72 basically provides a coarse adjustment value. In order to obtain an extremely high resolution in the analog-to-digital converter 62, the microcomputer causes the MDAC 72 to output a signal that consists of a value that will offset a substantial portion of the voltage from the qage head thereby confining the dynamic range output of the mixer to be a relatively small voltage. The mixer has actually subtracted a coarse adjustment value from the gage measurement signal and left a small amplitude signal which is representative of the difference between the MDAC output value and the actual gage head position. This small amplitude signal will next be conditioned by the D/H and the analog-to-digital converter to produce fine position information which will later be combined with the coarse position information to provide the exact qage position.

The coarse adjustment value is selected by means of a successive approximation. Each time the microcomputer passes through states 2 and 3, a new coarse adjustment value is tried and the output of the analog-to-digital converter 62 in response thereto is determined. If the output of the analog-to-digital converter is saturated, then the microcomputer knows that it must try another approximation on the next pass through that state. If a valid reading is obtained from the analog-to-digital converter, then that coarse adjustment value and the output of the analog-to-digital converter are valid and are stored for later use.

The coarse adjustment allows the unit to measure at a much finer resolution than if no coarse adjustment voltage was provided. Normally, the finest resolution possible for a given range setting would be limited by the number of bits of resolution, the voltage range of the ADC converter 62, and the full scale range setting of the unit. Provision of the coarse adjustment voltage, however, allows for a much greater amplification of the signal that is to be converted without saturating the ADC. Therefore, the ADC provides twelve bits of resolution over a much smaller measurement range than the actual full scale range setting.

As noted above, the MDAC produces a step error. This step error effects the coarse adjustment value and therefore leads to an additional type of error in the measurement. The present invention, however, also detects and compensates for this error. When the unit is initially powered up, the microcomputer causes the MDAC to output several reference values, including 7F and 80 hexadecimal (assuming an eight bit MDAC), and determines the ideal step value and the step error present in the 7F to 80 hexadecimal transition. The microcomputer then stores the value of the step error, which is a constant, and factors in that value when calculating the overall error correction value.

Structure of Programmable-Gain Demodulate-and-Hold Circuit

The output of the mixer and preamplifier circuit 54, although modified and amplified, is still a sinusoidal signal having phase indicating the direction of gage displacement and amplitude indicating the magnitude of gage displacement. This output is received by D/H on line 56.

Figure 5:
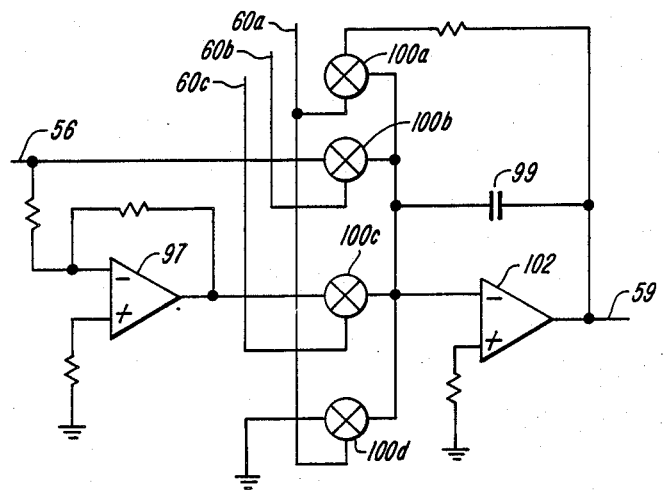
FIG. 5 shows exemplary circuitry for the programmable gain demodulate-and-hold circuit block of FIG. 3.

The programmable-gain D/H is shown in FIG. 5. The input signal from the mixer/preamplifier on line 56 is split and fed into switch 100b and an inverting operational amplifier 97 with a gain of $-1$. The output of the operational amplifier 97 is fed to switch 100c. The opposite leads of switches 100b and 100c are both connected to the inverting input of an operational amplifier 102 which is connected with capacitor 99 as an integrator. Switches 100a and 100d are also provided. When closed, switch 100a connects a resistor across the integrating amplifier 102 to discharge capacitor 99. Switch 100d ties the inverting input of the integrating amplifier of integrating amplifier 102 to ground when closed. Switches 100a and 100d are controlled by the programmable timing generator 41 via line 60a and are always switched in unison. Switches 100b and 100c are controlled by the programmable timing generator via lines 60b and 60c, respectively.

Operation of the Programmable-Gain Demodulate-and-Hold Circuit

The demodulate-and-hold circuit converts the signal received from the mixer/preamplifier circuit on line 56 and converts it into a steady-state voltage. The D/H is first set to one of two possible modes, "times 1" or "times 10". As will be described in more detail herein, the "times 10" mode simply provides 10 times the gain of the times "1 mode".

Figure 6:
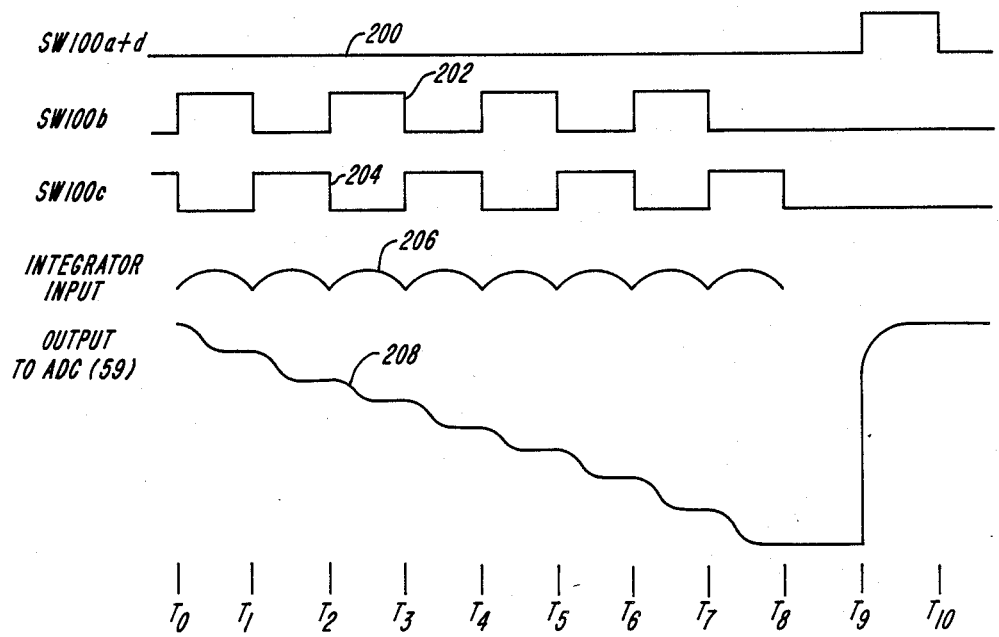
FIG. 6 shows a timing diagram of the operation of the programmable gain demodulate-and-hold circuit portion of the present invention operating in the "times 1" mode.

The timing diagram of FIG. 6 illustrates the manner in which the demodulate-and-hold circuit operates. The signals 200, 202 and 204 in FIG. 6 represent the switch control signals from the programmable timing generator to the switches 100a(and d), b and c, respectively. The "high" signal level closes the switches. Signal 206 represents the voltage that appears at the inverting input to the integrator amplifier 102. Signal 208 in FIG. 6 represents the output 59 of the demodulate-and-hold circuit 58 to the analog-to-digital converter 62. As shown in FIG. 6, the switches 100b and 100c are switched alternately for eight time periods at a rate of 25.6 kHz (i.e. every half cycle of the sinusoidal measurement signals from the gage head) and exactly in phase with the sinusoidal measurement signals from the gage head. Switches 100a and 100d remain open for this period. The alternate switching of switches 100b and 100c, as described above, "half-wave inverts" the sinusoidal voltage on line 56 by inverting the latter 180° portion of it. It should be obvious that this produces signal 206 shown in FIG. 6 at the input to the integrator 102. Further, it should also be clear that the output of the integrator 102 in response to the Integrator Input signal 206 at its inverting input will be the increasing negative voltage shown at 208. Signal 206 relates to what we shall call a positive offset from the zero position. If the gage head had been displaced in the opposite direction, the wave form at 206 would have been of the same shape except 180° phase shifted. Also, if the qage head had been displaced in the opposite direction, the signal shown at 208 would have been of the same shape except with positive polarity.

If there is a phase shift error introduced by the gage head, it can be corrected for in the present invention by simply programming the programmable timing generator 41 to produce an equivalent phase delay in its output on line 60 (60a, b, c). No external circuitry is required, as was the case with prior art electronic gage amplifiers.

At time T8, the programmable timing generator will cause all switches, 100a, 100b, 100c and 100d to open, causing the voltage 208 at the output 59 to remain steady. At such time T8, the microcomputer is interrupted from its current routine and services the ADC 62. The microcomputer reads the data previously converted by the ADC and instructs the ADC to begin converting the data newly available on line 59. The ADC completes the conversion at some time before T9. The programmable timing generator, at time T9, then closes switches 100a and 100d, discharging the integrating capacitor to ground and resetting the D/H 58 to begin another integrate and hold cycle at time T 10.

In the "times 10" mode, the D/H 58 operates in exactly the same manner except that instead of building the voltage for a period of eight time periods, the voltage is built over a period of eighty time periods. Since each of the time periods is of the same duration, this operation takes ten times the amount of time to build the steady-state voltage than in the "times 1" mode. Also, the voltage (or amplification) will be ten times greater than if it had been built in the "times 1" mode. When the range of the unit is set to the smallest scale, i.e. +/−0.0001", the microcomputer programs the D/H 58 to the "times 10" mode. When the range is set to any of the other scales, the microcomputer sets the D/H to the "times 1" mode. The provision of the "times 1" and "times 10" modes allows for the use of a substantial portion of the five volt range of the analog-to-digital converter 62 in any range setting, while still allowing for a broad spectrum of full scale ranges for the electronic gage amplifier unit. Very fine resolution can be provided in the smallest range in the "times 10" mode because a significant portion of the full range of the analog-to-digital converter 62 is utilized. Meanwhile, the three larger range settings can be provided in the "times 1" mode without exceeding the 5 volt range of the analog-to-digital converter 62. In contrast to the prior art electronic gage amplifiers, the demodulate and-hold circuit of the present invention provides gain which is digitally controlled by a programmable timing generator. Since the gain is controlled by digital signals, the ratio of gain can be switched digitally independent of the value of analog components in the circuit. Thus, a precisely controlled variable-gain amplifier is created which exhibits no change in basic performance (particularly phase shift) as gain is changed.

While the preferred embodiment provides only a "times 1" and a "times 10" mode, it should be understood that any number of amplification settings can be provided. For instance, in an alternate embodiment of the demodulator-and-hold circuit of the present invention, a different amplification is provided for each possible range setting.

It should be noted that the quadrature error voltage from the gage head is inherently eliminated by the present demodulation process. Since the quadrature voltage is 90° out of phase with the switching from the inverted to the non-inverted signal (switch 100b to switch 100c), the quadrature voltage is symmetrical about T1, T2, T3, T4, T5, T6 and T7. Exactly one half of the positive voltage swing of the quadrature voltage is added to the output being built on line 59, while the other half of the positive voltage swing is subtracted from the output being built on line 59. The same relationship holds true for the negative 180° swing of the quadrature voltage. At time T8 when the demodulator finishes building the output voltage on line 59, the quadrature voltage has been completely eliminated because half of it has been added and half of it has been subtracted.

Discussion of Data Collection Software Routine

Figure 10A:
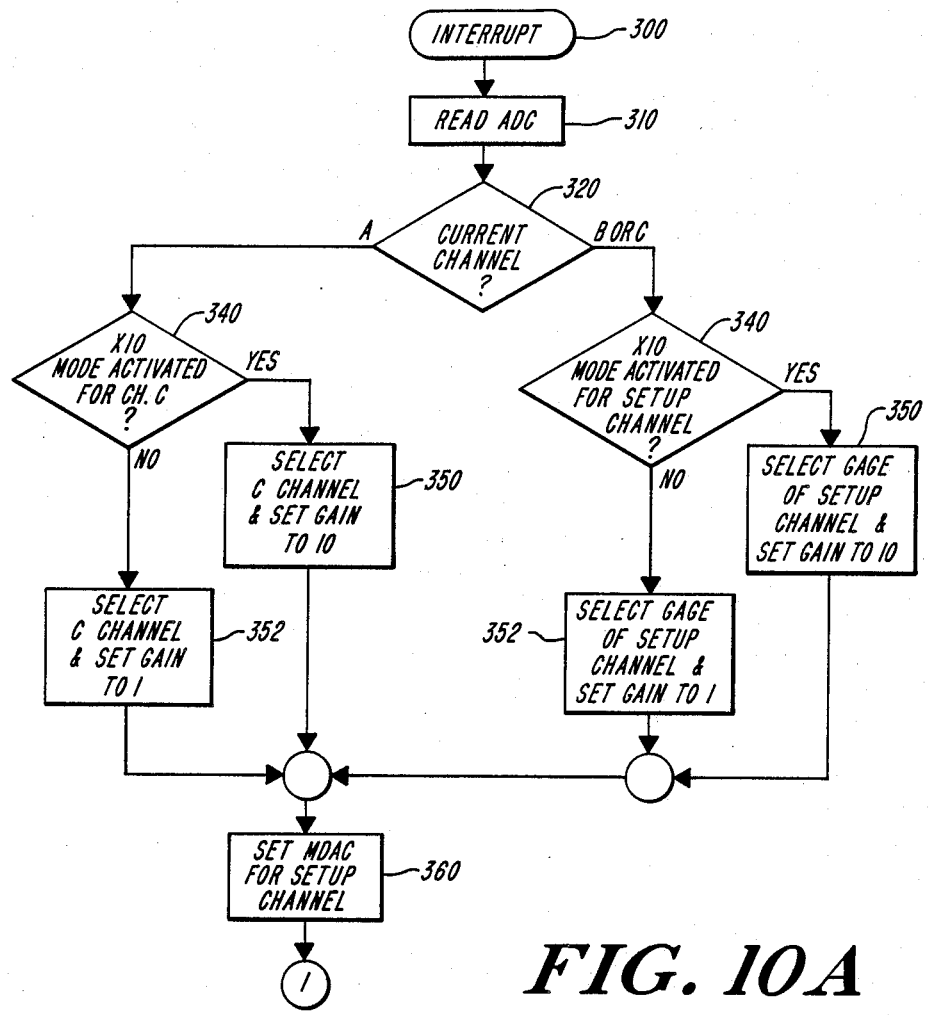
FIGS. 10A and 10B show a flow chart of the software used to control various functions of the invention in one preferred embodiment.
Figure 10B:
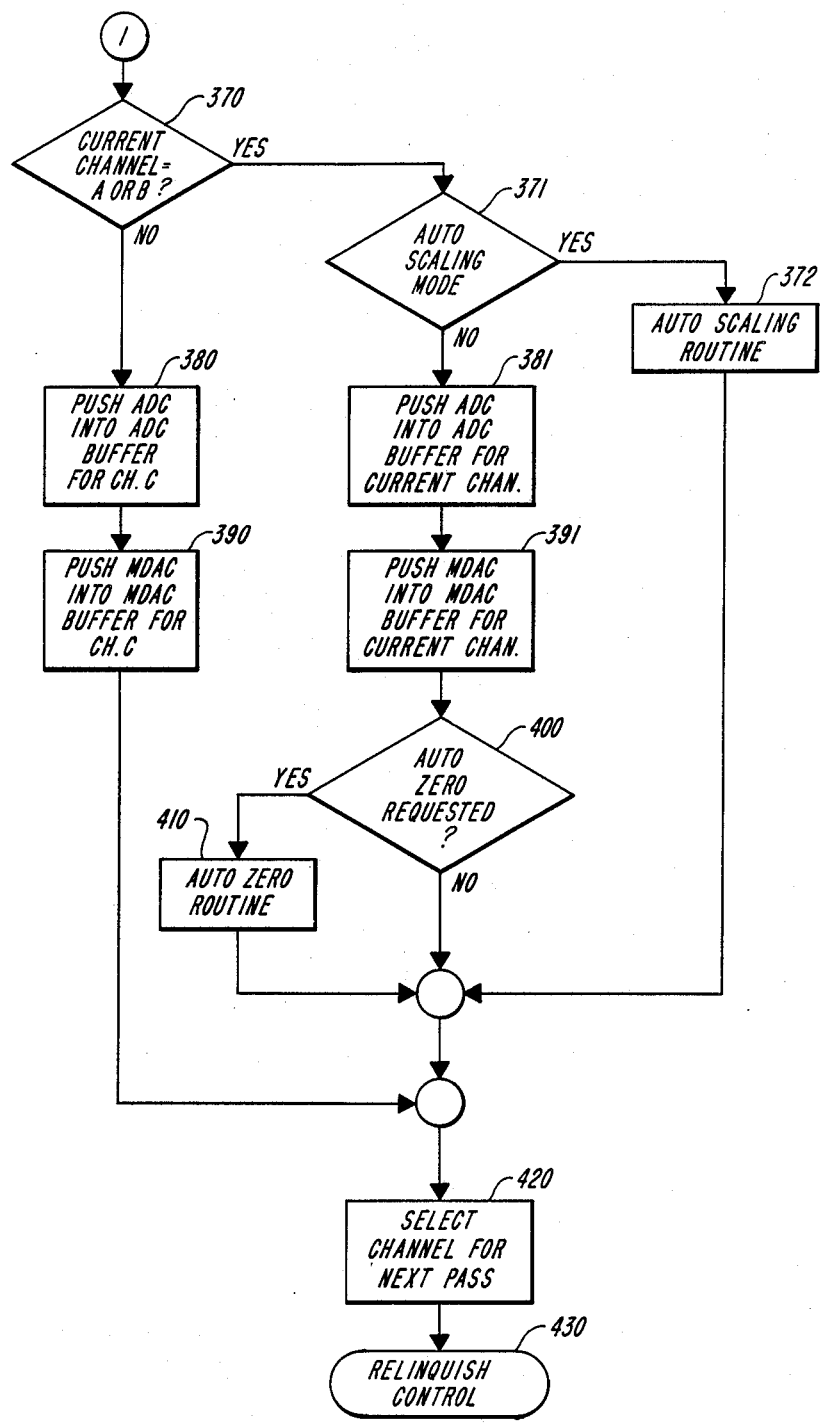

FIGS. 10A and 10B show a generalized flow diagram of the data collection portion of the software which may be used in a preferred embodiment of the present invention. It should be understood that FIG. 10 does not represent the full software needed to operate the unit or even to calculate measurement values based on the data collected. The software needed to operate the system disclosed in this specification, in addition to the data collection routine, would be plainly obvious to a person of ordinary skill in the art of computer programming. Additionally, much of the software, such as the interfacing of the keypad or the display element to the microcomputer is well known in the art and not germaine to the inventive concept of this application.

The data collection sequence begins at step 300 when the microcomputer receives an interrupt signal indicating that the D/H amplifier is in hold mode. In step 310 the microcomputer reads the data on the output lines of the ADC which, as will become apparent, contains the measurement data from the channel (gage A, gage B or channel C) which was set up during the two previous passes through this software. The process of reading the ADC also initiates a conversion of the voltage on the D/H amplifier. The channel corresponding to the voltage which is converted is called the "hold channel" in this discussion: the channel corresponding to the data which is read from the ADC in step 310 is called the "current channel": the channel which will be sampled on the next pass through this software and for which the hardware must be set during this pass is termed the "set-up" channel.

In step 320, the microcomputer determines what the set-up channel is and proceeds to step 340 where it determines the range currently selected for the set-up channel and whether the "times 10" mode is necessary. In steps 350 and 352, the microcomputer causes the hardware in the programmable gain D/H 58 to switch to the selected mode (times 1 or times 10) and writes the channel select instructions to the mixer 54. Steps 340, 350 and 352 are shown as two parallel sequences in FIG. 10 depending on the selection of the set-up channel. Although the parallel steps are basically similar, they are shown separately because channel C serves a fundamentally different purpose than channels A and B. Further, in the actual software, the programming steps are slightly different when channel C is the set-up channel than when channel A or B is the set-up channel.

In the next step, 360, the microcomputer sets up the MDAC to generate the desired reference signal if the set up up channel is channel A (or channel B). When setting up a coarse adjustment value for channel A (or channel B), the microcomputer uses a successive approximation algorithm (performed in a separate routine) to determine the correct coarse adjustment value. Therefore, the coarse adjustment value which is set in step 360 may not be the right value and therefore the ADC may produce an over-range output when it is read into the microcomputer, If the over-range reading occurs, then, on the next pass through this software for the current channel (actually 3 passes later, since the microcomputer must pass through this software for channels B and C before returning to channel A), a new successive approximation of the coarse adjustment value will be tried. The successive approximation algorithm, like all other calculations, is performed in a separate routine than the data collection routine shown in FIG. 10. Every time the microcomputer passes through this software for channel A, a new successive approximation value for the coarse adjustment will be tried until a valid reading is obtained from the ADC.

In Step 370, the software branches to one of two separate routines depending on whether the current channel is a gage measurement (channel A or B) or a reference voltage (Channel C). If it is a reference voltage, the program branches to step 380 and stores the current measurement value from ADC 62. Then in step 390, it stores the value of the reference voltage which was programmed into MDAC 72. Operation then flows to step 420 and the microcomputer selects and stores the channel which will be serviced on the next pass. Note that calculation of the error based on the information in the ADC buffer is not included in this routine. Those calculations will be performed in a separate routine.

If, instead of Channel C, one of the actual gage channels is the current channel, the microcomputer first determines if the auto-scaling mode is active in step 371. If so, the software runs through a routine which is generally shown as step 372 that determines the proper MDAC setting and then proceeds to step 420. If the auto scaling mode is not active, the ADC output is stored in an ADC buffer (see step 381) and the value of the corresponding MDAC setting (coarse adjustment) is stored in an MDAC buffer (see step 391). As described above, in a separate routine, the microcomputer will check the value in the ADC buffer to determine whether an over-range condition exists and if so will compute the next successive approximation for the coarse adjustment to be used on the next pass through this software.

Although step 391 as performed in relation to channels A and B is very similar to step 390 as performed in relation to channel C, it should be noted that data stored in the MDAC buffer is used for different purposes with respect to channels A and B than with respect to channel C. With respect to channels A and B, the value stored in the MDAC buffer is a coarse adjustment value which must be added to the value stored in the ADC buffer in order to determine the actual measured value as described above. However, with respect to channel C, the value in the MDAC buffer is needed by the microcomputer as a reference in order to compare it with the value in the ADC buffer so that it may calculate the necessary error correction.

Next, the microcomputer determines whether the auto zero mode is activated in step 400. If so, the microcomputer branches to step 410 which generally represents an auto zeroing routine. If the auto zero mode is not activated, the microcomputer branches to step 420. After selecting the channel for the next pass in step 420, the microcomputer, in step 430, then relinquishes control from the data collection portion of the software.

The microcomputer calculates the error values introduced by the circuitry in the unit in a separate routine. In yet another routine, the microcomputer reads the ADC buffer to obtain the fine measurement from gage A (or gage B), read the MDAC buffer to obtain the coarse adjustment data for channel A (or channel B), reads the error correction value which has previously been calculated and adds them all up to provide a true measurement value.

Additional Advantages of the Preferred Embodiment

The structure of the circuitry, particularly the use of a microcomputer to control system operation, offers great flexibility in the range of functions and features which the electronic gage amplifier of the present invention can be programmed to provide. Prior art electronic gage amplifiers do not offer the number and variety of functions and features which are incorporated into the preferred embodiment of the present invention.

Figure 11:
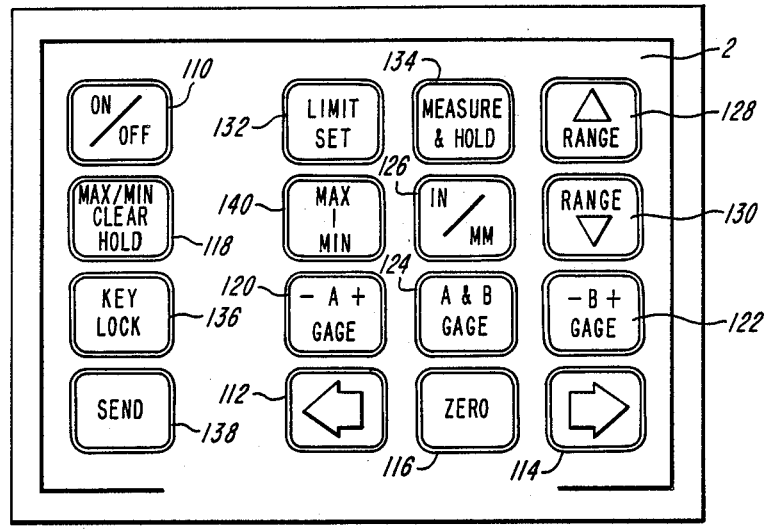
FIG. 11 shows the keypad of a preferred embodiment of the present invention.

Referring to FIGS. 2 and 11, the keypad 2 of the electronic gage amplifier is provided with 16 keys which provide a means for the operator to key in the desired functions or features. The gage amplifier unit has no knobs or switches. Knobs and switches are undesirable because they create excessive amounts of electrical noise and cause reliability problems because of their mechanical nature. Keypads, particularly touch sensitive keypads, are substantially less noisy and more reliable.

Keypad 2 and display 3 are interfaced to the microcomputer in a conventional fashion. Most of the functions and features provided through the keys on the keypad are what may be termed state functions. When the operator presses a key, the unit will enter into a state in accordance with the key pressed and remain in that state until another keystroke from the operator cancels that state. For instance, if the operator presses the Measure and Hold key 134, the unit enters the measure and hold mode and remains in that mode until the operator presses another key which cancels that mode. Therefore, when the operator presses a key on the keypad, the microcomputer responds by jumping to the section of software that corresponds to the selected mode. The microcomputer continues to execute the software for the selected mode and control the display accordingly until the operator presses another key that instructs the microcomputer to jump to a different location in the software.

The operator must press the on/off button 110 to toggle the device from off to on. When the unit is turned on, the microcomputer runs a system check and activates the LCD with the standard digital display as will be described in detail in relation to FIGS. 7, 8 and 9.

In a preferred embodiment, the electronic gage amplifier provides inputs for two gages. By using the A-gage selection key 120, B gage selection key 122 or A & B gage selection key 124, the operator can cause LCD 3 to display a number of different possible measurements. The operator can cause the LCD 3 to display the measurement from the gage plugged in to a designated A gage input connector by pressing the A-qage button 120. Repeated pressing of the A-gage button toggles the displacement polarity from positive to negative and back. The B-gage key operates in exactly the same manner except that it causes the measurement coming in from the gage connected to the B qage input to be displayed. Assuming that gages are connected to both the A gage and B gage input connectors, pressing the A & B gage keypad 124 causes the algebraic sum of the A and B gage signals to be displayed on the LCD.

Pressing the in/mm keypad 126 causes the display to toggle back and forth to displaying the measurement in either inches or millimeters. The microcomputer converts from millimeters to inches simply by multiplying the measurement by a scale factor. Therefore, the measurements given in inches and millimeters are always exactly equal.

In the preferred embodiments, the electronic qage amplifier of the present invention provides four different amplification range settings as listed in the tables below.

| Range and resolution - Inches - | | |
|---|---|---|
| Full-scale Range | Digital Resolution | Bargraph Resolution |
| Automatic | Automatic | Automatic |
| +/−.1" | .001" | .005" |
| +/−.01" | .0001" | .0005" |
| +/−.001" | .00001" | .00005" |
| +/−.0001" | .000001" | .000005" |

| Range and Resolution - Millimeters - | | |
|---|---|---|
| Full-scale Range | Digital Resolution | Bargraph Resolution |
| Automatic | Automatic | Automatic |
| +/−2.0 mm | 0.01 mm | 0.1 mm |
| +/−0.2 mm | 0.001 mm | 0.01 mm |
| +/−0.02 mm | 0.0001 mm | 0.001 mm |
| +/−0.002 mm | 0.00002 mm | 0.0001 mm |

The operator can select the range desired by pressing the "up range" key 128 or "down range" key 130. The "down range" key increases amplification, and decreases range. The "increase range" key decreases amplification, and increases range. The operator alternately may select the "automatic range" mode, which is an additional feature of the preferred embodiment. The operator may select "automatic range" mode, by pressing the "up range" key 128 until "AUTO" is displayed on the LCD 3. In the automatic range mode, the microcomputer automatically switches the unit to the smallest range setting within which the current measurement fits.

The gage amplifier of the present invention provides manual, automatic, and absolute zeroing features as explained herein. The term zeroing refers to the feature which allows the operator to set the LCD to display a zero measurement at any point in the displacement range of the gage head and produces an accurately measured displacement from that point rather than from the actual mechanical zero point of the gage head. The operator may manually set the unit to read zero at any point within the displacement range of the gage head simply by pressing the left and right arrow keys 112 and 114. Pressing the left arrow key 112 causes the measurement displayed on the LCD 3 to decrease in value; that is, it causes the zero point to move up. Pressing the right arrow key 114 produces the opposite result. Pressing either of the arrow buttons 112 or 114 once causes the display to move one unit of resolution in the selected range toward the specified direction. Holding either of the arrow keys down for two seconds causes the display to count rapidly in the specified direction.

Unlike in the prior art electronic gage amplifiers, the microcomputer in the present invention can provide the zeroing functions in an extremely easy fashion. The microcomputer simply keeps track of the point at which the operator sets the zero in comparison to the actual mechanical zero point of the gage head and digitally adds or subtracts the value corresponding to the distance between the set zero and the actual mechanical zero from the digital measurement value that it receives on lines 64.

When the user wishes to set the zero point of the display at the current position of the gage head, he may manually zero it by using keys 112 and 114 or he may use the automatic zeroing function. If the operator presses the ZERO key 116, the display automatically displays zero. If the measurement is outside the range of the automatic zero capability, then the microcomputer causes the display to show a series of preselected characters such as dashes where the measurement would normally be displayed, to indicate the over-range condition. The operator may press the CLEAR button 118 to reset the unit and restore a normal display. If the ZERO keypad 116 is pressed when the unit is in the A & B gage mode, both gages are zeroed.

The present invention also provides an absolute zero function. When the operator presses and holds the zero key 116 for more than two seconds, the microcomputer sets the display so that its zero position is centered exactly at the mechanical zero of the gage head.

The microcomputer can find the mechanical zero point of the gage head by measuring the absolute value of the input from the gage head, determining the amplitude and phase of the signal, convertinq the amplitude and phase into a measurement of the distance of the gage head from its mechanical zero position (the point at which the gage output is zero volts), and causing the LCD 3 to display that distance.

Normally, the electronic gage amplifier displays the measurement which is currently on the selected gage or gages. However, when the MEASURE AND HOLD key 134 is pressed, the display holds the measurement which was being displayed at the time when the MEASURE AND HOLD key was pressed. The LCD 3 displays this value until the MEASURE AND HOLD key is pressed again, at which time it will display and hold the measurement that was present on the gage head at that point in time. In response to the pressing of MEASURE AND HOLD key 134, the microcomputer remains in the continuous measurement mode in every way except for the fact that it will not output the measurements to the display 3, except at the point in time when the MEASURE AND HOLD key is pressed. To clear the measure and hold mode, the operator simply presses the CLEAR key 118.

The preferred embodiment also offers a KEY LOCK key 136. This key is provided to prevent accidental keypad strokes from affecting the amplifier settings. Pressing the KEY LOCK key 136 "locks" the keypad so that the present setting cannot be affected by pressing any of the keys. In other words, when KEY LOCK 136 is pressed, the key pad is deactivated. To disengage the KEY LOCK mode, the operator simply presses and holds the KEY LOCK key 136 for two seconds.

Yet another feature is provided through the MAX/MIN key 140. The microcomputer continuously calculates the maximum, average, difference, and minimum of a series of measurements and stores the values in memory. These measurements can be collected either continuously as a gage scans a surface, or one point at a time in the measure and hold mode. The operator can clear the values stored and restart the data collection process by pressing the CLEAR key 118. The values may be displayed by pressing the MAX/MIN key 140. At any point in time, the operator may press the MAX/MIN key 140 and the display will toggle from displaying the maximum to the average to the difference to the minimum each time the key is depressed.

The maximum value is simply the highest value encountered since the values were last cleared. The minimum value is simply the lowest value encountered since the values were last cleared. The average value is one half the sum of the maximum value and minimum value. Finally, the difference value is the difference between the maximum value and the minimum value.

The preferred embodiment of the unit is also provided with a calibration switch (not shown) which can be used for calibrating the gain of the unit when a gage head of unknown accuracy is connected to the unit. Frequently, the gage heads used in conjunction with electronic qage amplifiers do not have identical gain from device to device. The electronic gage amplifier of the present invention provides means to correct for the inaccuracies of various gage heads. When the calibrate switch is activated, the operator may place a known reference piece under the gage head to obtain a measurement reading. If the measurement reading is incorrect, the operator may use the left and right arrow keys 112 and 114 to move the display to the correct value. When the operator deactivates the calibration switch, the microcomputer will adjust the gain provided by the software to correct for the gage head inaccuracies. The gain adjustment is made entirely within the software and therefore no hardware adjustments are made, as was required in the prior art.

Display Features

With the wide range features and functions provided in this single unit, it is essential that the unit display, in an easily readable fashion, exactly what measurement is being displayed and what features are activated. The electronic gage amplifier of the present invention accomplishes this by providing all relevant information about a measurement on the LCD display 3 in an easily readable fashion.

Figure 7:
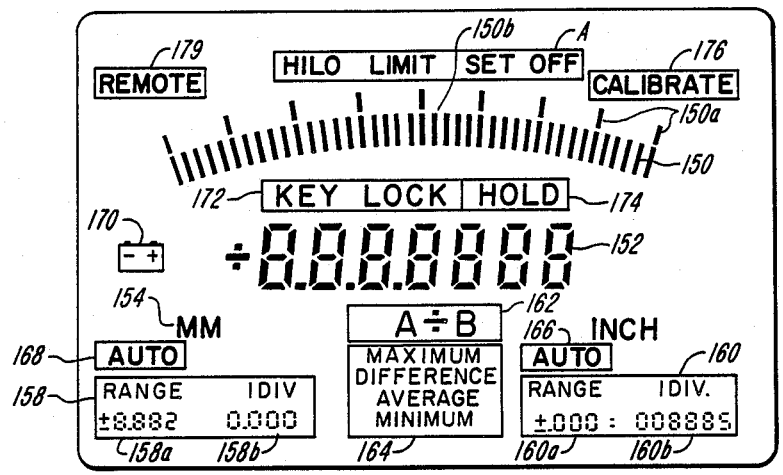
FIG. 7 shows the liquid crystal display of a preferred embodiment of the present invention.
Figure 8:
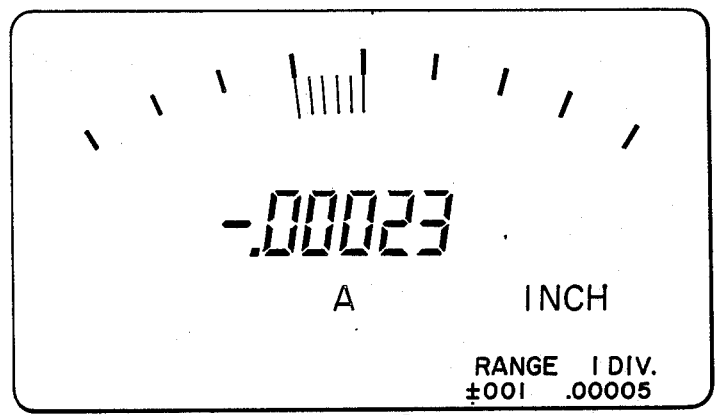
FIGS. 8 and 9 show the liquid crystal display of FIG. 7 in two possible modes.
Figure 9:
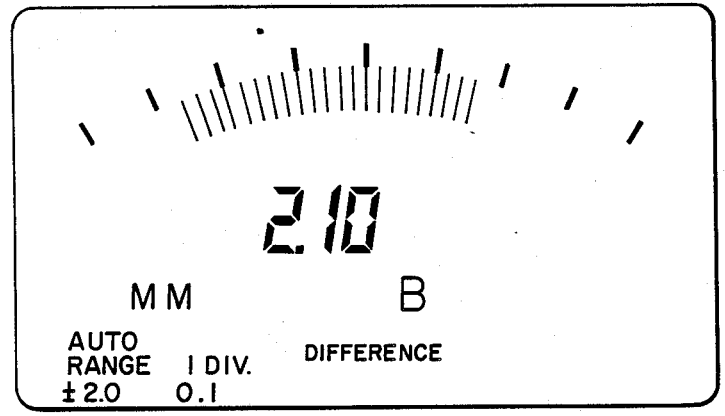

FIG. 7 shows all display fields of the LCD display 3. In normal operation, only a small number of these display fields will be activated at any given time. Since FIG. 7, which shows every possible field which can be displayed, may make it seem difficult to extract the desired information from the display, FIGS. 8 and 9 are provided to show two typical displays which might actually occur during normal use. It should be understood that the display will never appear as busy as is shown in FIG. 7.

The bar graph field 150 and the digital number field 52 are always active. The top bars 150a are always active while the more closely spaced bottom bars 150b will light up progressively to indicate the current gage measurement. Either the millimeter field 154 or the inch field 156 will be active in order to show the units of the measurement. To keep the measurement information easily readable, two field, 158 and 160, are provided for displaying the range selected and the units of resolution in that range. When the inches mode is activated, only field 160 will display the range and division. Likewise, when the unit is in the millimeter mode, only field 158 will show the range and division information.

Further, field 162 displays which gage measurements are currently being displayed and in what combination. Also, field 164 displays one of the maximum, difference, average or minimum subfields when one of those values is being displayed in fields 150 and 152.

If the auto range mode is activated, either field 166 or 168 is active to indicate that fact, depending on the units (inches or millimeters) displayed. Field 170 is activated by the microcomputer when the batteries of the unit are running low. Field 172 is activated when the key lock feature is turned on and field 174 is activated when the unit is in the measure and hold mode.

Several other fields are provided above the bar graph field 150. Field 178 is active when the limit set mode is activated. The limit set mode merely allows the operator to specify high and low limits such that, when either limit is exceeded, the LED lights 4, 5 and 6 above the LCD display 3 (see FIG. 2) indicate the violation of a set limit. The microcomputer activates light 4 when the low limit is exceeded, and activate light 6 when the high limit is exceeded. The microcomputer activates LED 5 when this mode is activated so that the operator may know that the unit is measuring with limits. Field 178 displays either HI LIMIT SET, LO LIMIT SET or LIMIT SET OFF to inform the operator which mode the unit is in as the LIMIT key is toggled through its sequence.

In the preferred embodiment of the present invention, a calibrate mode is also provided. Field 176 is activated when this mode is in its active state.

FIGS. 8 and 9 are provided to illustrate how readable the display will be during normal operation of the unit. In FIG. 8 it can be seen at a single glance that there is a measurement of −0.00023 inches being read off of the A gage. It also indicates the range setting and the divisions in the range in which the device is currently set.

Likewise, FIG. 9 shows, at a glance, that the difference between the maximum and the minimum measurement on the B-gage is 2.10 mm. The display also indicates that the auto range feature is activated. Note that the bar graph in FIG. 9 is programmed to show the range from maximum to minimum of the measurements when in the difference mode. It should also be noted that when the units of the measurement are in inches, the units, range, division, and auto range feature information are all displayed in the lower right hand corner of the LDC 3. When the units are in millimeters, the same information is displayed in the lower left hand corner. There are two benefits to having the display arranged in this manner. First, the most important information about the measurement always appears in a single small area. Second, the operator can tell virtually instantaneously, what the units are simply by observing whether the lower left side or lower right side of the display is active.

Having thus described one preferred embodiment of the present invention, various alterations and modifications will become obvious to those persons skilled in the art. Such obvious alterations and modifications are intended to be included within the scope of this invention which is not to be interpreted as limited by the above description of a preferred embodiment. The foregoing description is presented by way of example only. The appended claims define the only limits upon the scope of this invention.

I claim:

1. An electronic gage amplifier comprising:
   means for receiving electrical signals from a transducer of a type that converts measurement values to sinusoidal electrical signals;
   means for generating and supplying at least one known sinusoidal reference signal to said means for receiving;

means, coupled to said means for receiving, for converting selectively said electrical signals and said reference signals to digital words representative of said measurement values and said reference values, respectively;

means, coupled to said means for converting, for storing said digital words;

means, coupled to said means for storing, for calculating error values as a function of the difference between said digital words representative of said reference values and predetermined digital words corresponding to said reference values;

means, coupled to said means for calculating error values and said means for converting, for digitally combining said error values with said digital words representative of said measurement values to produce corrected measurement values; and means, coupled to said means for combining, for displaying said corrected measurement values.

2. An electronic gage amplifier as set forth in claim 1 wherein said means for converting comprises:

means for translating said sinusoidal electrical signals and said sinusoidal reference signals into voltage levels; and analog-to-digital converter means for converting said voltage levels to digital words.

3. An electronic gage amplifier as set forth in claim 2 wherein said means for translating comprises:

half wave inverter means having an input comprising the input of said means for translating and an output;

an integrator having an input coupled to the output of said half wave inverter means and an output; and means for holding the output of said integrator for a specified period of time.

4. An electronic gage amplifier as set forth in claim 3 wherein said means for displaying includes;

a digital readout of said corrected measurement values, including a polarity indicator;

a simulated analog readout of said corrected measurement values;

the units of the measurement readout;

an indication identifying the transducer or transducers which provided the measurement signals corresponding to the readout and, where the readout represents some combination of the measurement signals of multiple transducers, the manner in which the measurement signals are combined;

an indication of the range of measurements possible; and an indication of the resolution of the readout.

5. An electronic gage amplifier as set forth in claim 4 further comprising:

6. An electronic gage amplifier as set forth in claim 5 further comprising means on said key pad for allowing an operator to set a maximum and/or minimum measurement value such that when a measurement value from said transducer exceeds either limit, a signal is generated which indicates such condition.

7. An electronic gage amplifier as set forth in claim 5 further comprising means on said key pad for allowing an operator to set, via a key on said keypad, said electronic gage amplifier to one of two modes, wherein, in said first mode, the instant measurement value is selected when a HOLD key is pressed and displayed until the next time said HOLD key is pressed, and, in said second mode, an instant measurement value is displayed at all times.

a microcomputer coupled to all of said elements of said electronic gage amplifier for controlling operation of said electronic gage amplifier and the information displayed by said means for displaying; and a keypad coupled to said microcomputer for allowing an operator to selectively program operation of said electronic gage amplifier.

8. An electronic gage amplifier as set forth in claim 5 further comprising means on said key pad for allowing an operator to set said microcomputer to calculate and store the group of values comprising the maximum measurement, minimum measurement, average of the maximum and minimum measurements and difference between the maximum and minimum measurement value registered on said transducer over a specified period of time and display a member of said group of values.

9. An electronic gage amplifier as set forth in claim 5 wherein means are provided for deactivating and reactivating said keypad.

10. An electronic gage amplifier as set forth in claim 5 wherein means are provided on said keypad for allowing an operator to program said microcomputer to cause said means for displaying to display a measurement of zero in response to any input signal from said transducer and measure displacement from a position represented by said zero signal.

11. An electronic qage amplifier as set forth in claim 6 wherein means are provided on said keypad for allowing an operator to program said microcomputer to define said zero signal for said transducer at said transducer's instant position with a touch of a key.

12. An electronic gage amplifier as set forth in claim 5 wherein means are provided on said keypad for allowing an operator to program said microcomputer to cause said electronic gage amplifier to provide one of a group of full scale measurement ranges.

13. An electronic gage amplifier as set forth in claim 12 further comprising means on said key pad for allowing an operator to set said microcomputer to automatically select the smallest full scale measurement range for which an instant measurement value does not exceed said range.

14. An electronic gage amplifier comprising:

means for receiving signals from a transducer of a type that converts measurements into sinusoidal electrical signals, said signals being termed measurement signals;

a microcomputer;

means for providing to said transducer two sinusoidal driving voltages 180° out of phase with each other;

a mixer circuit having inputs coupled to said means for receiving signals and further having an output, said mixer circuit being programmable to selectively combine signals received at its inputs;

translation means coupled to the output of said mixer providing voltage levels corresponding to the output of said mixer;

an analog-to-digital converter (ADC) coupled to the output of said translation means, the output of said ADC providing ADC output vales to said microcomputer corresponding to said voltage levels;

means within said microcomputer for storing said ADC output values;

means coupled to an input of said mixer for providing reference signals to said mixer; and means for reading the ADC output values provided in response to said reference signals, determining the errors introduced into said ADC output values by said mixer, translation means and ADC, and correcting said ADC output values to produce a corrected measurement value.

15. An electronic gage amplifier as set forth in claim 14 wherein said means for providing reference signals to said mixer comprises means for providing coarse adjustment sinusoidal signals having amplitudes slightly smaller than the instant measurement signals and 180° out of phase therewith;

said electronic gage amplifier further comprising:
means coupled to said mixer for programming said mixer to combine said coarse adjustment signals with said measurement signals so as to produce fine adjustment signals at the output of said mixer;
said ADC output values in response to said fine adjustment signals being termed fine adjustment ADC output values; and
means within said microcomputer for adding digital words representative of said coarse adjustment value to said corrected measurement values obtained in response to said fine adjustment ADC output values to produce true measurement values.

16. An electronic gage amplifier as set forth in claim 15 wherein:
said means for providing reference signals to said mixer comprises a multiplying digital-to-analog converter (MDAC);
said MDAC having inputs coupled to the output of said means for providing sinusoidal voltages and being controlled by said microcomputer to output an attenuated version of one of said sinusoidal voltages to said mixer.

17. An electronic gage amplifier as set forth in claim 15 wherein said microcomputer compensates for said errors by subtracting a digital word representing said errors from said digital word representative of a measurement value to produce said corrected measurement value.

18. An electronic gage amplifier as set forth in claim 15 further comprising means for displaying said true measurement value.

19. An electronic gage amplifier as set forth in claim 18 wherein said translation means comprises:
half wave inverter means having an input being the input of said translation means and an output;
an integrator having an input coupled to the output of said half wave inverter means and an output; and
means for holding the output of said integrator for a specified period of time.

20. An electronic gage amplifier as set forth in claim 19 wherein said means for displaying includes:
a digital readout of said true measurement value, including a polarity indicator;
a simulated analog readout of said true measurement value;
the units of the measurement readout;
an indication of which transducer or transducers the readout relates to and, if it relates to more than one transducer, the manner in which the transducer outputs are combined;
an indication of the range of measurements possible; and
an indication of the resolution of the readout.

21. An electronic gage amplifier as set forth in claim 20 further comprising a keypad coupled to said microcomputer for allowing an operator to selectively instruct said microcomputer to control operation of said electronic gage amplifier.

22. An electronic qage amplifier a set forth in claim 21 wherein an operator can set, via the keypad, a maximum and/or minimum measurement value such that when a measurement value from said transducer exceeds either limit, a signal is generated which indicates such condition.

23. An electronic gage amplifier as set forth in claim 21 wherein an operator can set, via a key on said keypad, said electronic gage amplifier to one of two modes, wherein, in said first mode, when a HOLD key is pressed, the instant measurement value is selected and displayed until the next time said HOLD key is pressed, and, in said second mode, the instant measurement value is displayed at all times.

24. An electronic gage amplifier as set forth in claim 21 wherein means are provided for deactivating and reactivating said keypad. Claim 20 further comprising a keypad coupled to said microcomputer for allowing an operator to selectively instruct said microcomputer to control operation of said electronic gage amplifier.

25. An electronic gage amplifier as set forth in claim 21 wherein means are provided on said keypad for allowing an operator to program said microcomputer to cause said means for displaying to display a measurement of zero in response to any input signal from said transducer and measure displacement from a position represented by said zero signal.

26. An electronic gage amplifier as set forth in claim 25 wherein means are provided on said keypad for allowing an operator to program said microcomputer to define said zero signal for said transducer at said transducer's instant position with a touch of a key.

27. An electronic gage amplifier as set forth in claim 26 wherein said microcomputer can be set, via said keypad, to calculate and store a group of values comprising a maximum measurement, minimum measurement, average of said maximum and minimum measurements and difference between said maximum and minimum measurements registered on said transducer over a specified period of time and display any one element of said group of values.

28. An electronic qage amplifier as set forth in claim 26 wherein means are provided on said keypad for allowing an operator to program said microcomputer to one of a group of full scale measurement ranges.

29. An electronic qage amplifier as set forth in claim 28 wherein an operator may set said microcomputer to automatically select the smallest full scale measurement range in which the instant measurement value does not exceed said range.

30. A method for converting an electrical signal representative of measurement data from a transducer, said electrical signal being termed the measurement signal, to a visual display of said data, said method comprising the steps of:
receiving said measurement signal;
converting said measurement signal into a first digital word representative of said measurement data by use of conversion means;
converting a known reference signal into a second digital word by use of the same conversion means that said measurement signal was converted into a digital word;

calculating the difference between said second digital word and a known digital word representative of said known reference signal;

generating, as a function of said difference, a digital word representing an error introduced to said measurement data in said conversion step; and obtaining a corrected digital word representative of said measurement data as a function of said first digital word and said digital word representing an error.

31. A method of converting an electrical signal representative of measurement data from a transducer, said electrical signal being termed the measurement signal, to a visual display of said data comprising the steps of:

receiving said measurement signal;

mixing said measurement signal with a coarse adjustment signal having an amplitude slightly less than said measurement signal and 180° out of phase therewith to produce a fine adjustment signal.

converting said fine adjustment signal into a digital word representative of said fine adjustment signal;

adding a digital word representative of said coarse adjustment signal to said digital word representative of said fine adjustment signal to produce a full measurement value;

converting said full measurement value to a visual display.

32. A method of converting an electrical signal representative of measurement data from a transducer, said electrical signal being termed the measurement signal, to a visual display of said data comprising the steps of:

receiving said measurement signal;

mixing said measurement signal with a coarse adjustment signal having an amplitude slightly less than said measurement signal and 180° out of phase therewith, to produce a fine adjustment signal;

converting said fine adjustment signal into a first digital word representative of said measurement data by use of conversion means;

converting a known reference signal into a second digital word by use of the same conversion means that said measurement signal was converted into a digital word;

calculating a difference between said second digital word and a known digital word representative of said known reference signal;

determining, as a function of said difference, a value for any error introduced to said measurement data in said conversion step;

obtaining a corrected digital word representative of said fine adjustment signal as a function of said first digital word and said error value;

adding a digital word representative of said coarse adjustment value to said corrected digital word to produce a true measurement value; and converting said true measurement value into a visual display.

* * * * *